United States Patent [19]

Findler et al.

[11] Patent Number: 5,071,510

[45] Date of Patent: Dec. 10, 1991

[54] PROCESS FOR ANISOTROPIC ETCHING OF SILICON PLATES

[75] Inventors: Guenther Findler, Stuttgart; Horst Muenzel, Reutlingen, both of Fed. Rep. of Germany

[73] Assignee: Robert Bosch GmbH, Stuttgart, Fed. Rep. of Germany

[21] Appl. No.: 586,803

[22] Filed: Sep. 24, 1990

[30] Foreign Application Priority Data

Sep. 22, 1989 [DE] Fed. Rep. of Germany ....... 3931590
Feb. 6, 1990 [DE] Fed. Rep. of Germany ....... 4003472

[51] Int. Cl.$^5$ .................... H01L 21/306; B44C 1/22; C03C 15/00; C03C 25/06
[52] U.S. Cl. .................................. 156/647; 156/627; 156/628; 156/651; 156/653; 156/657; 156/661.1; 156/662; 204/129.65; 437/238; 437/241; 437/245
[58] Field of Search ............... 252/79.5; 156/627, 628, 156/644, 647, 651, 653, 657, 659.1, 661.1, 662; 204/129.1, 129.2, 129.4, 129.65, 129.75; 427/38; 437/228, 238, 241, 245

[56] References Cited

U.S. PATENT DOCUMENTS

| | | | |
|---|---|---|---|
| 4,089,704 | 5/1978 | Heiss et al. | 252/79.5 X |
| 4,113,551 | 9/1978 | Bassous et al. | 156/662 |
| 4,172,005 | 10/1979 | Muraoka et al. | 156/647 |
| 4,765,865 | 8/1988 | Gealer et al. | 156/647 |

FOREIGN PATENT DOCUMENTS

WO89/08323 9/1989 PCT Int'l Appl. .

OTHER PUBLICATIONS

RCA Review—"Chemical Etching of Silicon, Germanium, Gallium Arsenide, and Gallium Phosphide", by Werner Kern, vol. 39, Jun. 1978, pp. 278–308.

Primary Examiner—William A. Powell
Attorney, Agent, or Firm—Frishauf, Holtz, Goodman & Woodward

[57] ABSTRACT

Electrochemical etching of silicon wafers or plates, on the front side of which a monocrystalline epitaxy layer is provided having a doping of a type opposite to the doping of the remainder of the silicon plate, so as to provide a pn or np junction, is performed with an organic photo film material of negative type and polyisoprene base serving as a passivating layer on the previously etched and metallized front (epitaxy) side. The film layer is held in place with the help of an adhesion promoting silane compound and covers the entire front side including the portions previously masked with silicon nitride or oxide. It is dried and hardened before exposure to the etchant which is used to etch the rear side of the plate until the etchant reaches the pn junction, where a small voltage bias applied to the junction from the front side assures an etch-stop. Etchants containing tetraalkylammonium hydroxide in water solution or in water-free form are preferred, with various additives as inhibitors, complexing agents and/or wetting agents.

45 Claims, 2 Drawing Sheets

PROCESS FOR ANISOTROPIC ETCHING OF SILICON PLATES

This invention concerns electrochemical etching of silicon plates, especially for producing semiconductor devices as micromechanical components of a monocrystalline silicon plate or portion thereof in which the silicon plate consists of a substrate of n-doped or p-doped silicon and a monocrystalline silicon layer is located at the front side of the plate and is doped differently from the doping of the substrate, so that a doping junction or transition is present. The front side of the plate in this case is completely covered with a passivating layer.

BACKGROUND AND PRIOR ART

Wet chemistry anisotropic processes are known for producing, in silicon wafers, electronic circuit components having micromechanical structures and functions. A known method for controlling the termination or completion of the etching process at a particular residual silicon thickness (membrane thickness) is the so-called electrochemical etch-stop. This process is based upon drastic reduction of the etching rate of the silicon when the advancing etching front in the silicon surface reaches the space charge zone of a pn junction formed by the presence of an epitaxial layer.

The falling off of the etching rate can be detected externally by a change of the current between the epitaxial layer and an electrode immersed in the etching solution.

The electrochemical etch-stop is particularly interesting from the point of view of manufacturing technology, because it permits the controlled provision of particular silicon membrane thicknesses with a better layer thickness homogeneity over each wafer and from wafer to wafer.

A further possibility for controlling the termination of the etching process is, for example, a p+ layer, which is either epitaxially applied or diffused into the silicon as an etch-stop, because the etching rate of silicon drops off sharply when a zone of sufficiently high p-doping is reached as the result of changed electrochemical potentials at the crystal surface.

The deposition of an epitaxial layer of a doping type opposite to that of the silicon substrate serves as technological preparation for the etching process. This layer may be of n-doped or of p-doped silicon. This layer is contacted in a following structurizing topographic modification process. For that purpose contact application by diffusion or contact implantation is carried out through a masking layer and then a metallic layer of aluminum is applied and structurized. The purpose of the metal layer is to connect the pn junction externally. The metal layer can serve also for wiring of an integrated circuit on the front side of the silicon plate.

On the rear side of the silicon plate a sequence of masking layers is deposited and structurized. These layers usually consist of $Si_3N_4$ or $SiO_2$. The etching solution can locally etch in through window openings in these layers.

For the above-named electrochemical pn etch-stop it is necessary, to provide electrical bias of the pn junction on the wafer or plate front side. This is usually done by connection to metallization consisting of aluminum. In the case of integrated sensors, integrated circuits with aluminum metallization are present also on the front side of a plate or wafer. In this case the problems described below appear as a rule.

Aluminum conduction paths tend to form hillocks during tempering. Aluminum layers which are sputtered into place at a temperature below 100° C. or are vapor-deposited have a fine-grain structure of a grain size of typically 50–100 nm. When the temperature is raised to the region of 400° C. to 450° C. for the tempering necessary to provide good electrical contact properties, aluminum grains grow up to a size of 1.5 um, the maximum size depending upon the layer thickness. Under certain conditions, for example at a relatively high vapor deposition temperature, the grains can grow even to 3 um in size in the case of conventionally used layer thicknesses. These grains (now hillocks) grow at a few locations out of the aluminum layer upper surface and produce projecting pointed outgrowths.

Since the aluminum is strongly attacked from the usual bases that are used as electrochemical etching media, the metallization must be protected with a passivating layer. No satisfactory solution could be found heretofore by the use of inorganic masking layers as passivating layers, as for example like the previously mentioned masking layer sequence for the rear side of the silicon plate. As a result up to now no adequate passivating quality has been obtainable with the so-called LPCVD process and the so-called PECVD process. The defect density of the masking layer is so high on account of the complex topography of the aluminum layers showing hillocks that as a result substantial etching attack of the aluminum occurs to an intolerable degree.

Another kind of passivating of the front side of a silicon plate (EP 0 309 782 A1) for an anisotropic etching process with pn etch-stop provides for attaching a glass cover on the front side of the silicon plate or wafer. This process is evidently too expensive to be practical.

A further possibility of carrying out etching with pn etch-stop involves applying a gold layer which is resistant to the etching media for the purpose of passivating the front side of the plate. The disadvantage of this technology is that gold is not compatible with semiconductor manufacture on account of its electrical properties that makes its presence a center of disturbance in silicon.

Since another way of performing etching with pn etch-stop (B.Kloeck): IEE Tr.El.Dev. 36(4), 663 ff, 1989), is the use of etch doses in which a silicon plate is clamped in place. These are so held that their front plate sides are not reached by the etching solution while the rear side of the plate is open to the etching solution. These etch doses are designed only for single plates, so their use is generally troublesome or expensive. This process is accordingly not suitable for mass production of semiconductors.

Organic masking layers have not heretofore come into consideration, since it has been assumed that they would not withstand an anisotropic etching process.

For electrochemical etching processes in which the etching attack takes place preferably at particular crystal planes, basic etching media are often used that have temperatures typically between 20° C. and 100° C. A characteristic of all the heretofore known etching solutions of that kind is that the attack of the (111) plane of silicon proceeds most slowly and the attack of the (100) planes which are important for the currently conventional MOS and bipolar technologies takes place faster.

In the electrochemical etching of (100)-oriented silicon plates with a mask, depressions or pits are typically produced in the surface which are bounded by the (111) planes, the so-called "V" structures. The etching rate in the known etching media, for higher indexed planes lies higher than the rates of the (100) plane. This effect has proved to be disadavantageous in the etching of convex relief structures, i.e. structures with outwardly standing corners, as for example seismic masses in the form of pyramids. The outwardly directed corners of such structures are particularly strongly attacked by the known etching media because of their different crystal-orientations, so that complicated masking precautions are necessary for mitigating the etching attack in the planning of component geometries.

It is therefore desirable to find an etching medium that has the highest anisotropy between (111) and (100) planes and with which the higher indexed planes are not etched faster than the (100) plane An etching medium with such isotropy properties would importantly simplify the design of micromechanical components. From the production technology point of view the following requirements are desired of the etching media: The ratio of the etching rate of silicon to that of the masking layers, which is to say the selectivity, must be great. The conventional masking layers, as mentioned above, have been preferably of $SiO_2$ and $Si_3N_4$. In order to obtain sufficient throughput in the process, the etching rate must be high. It should lie in the region of about 50 um per hour. The etching solution should have a high degree of purity with respect to contamination by metal ions, especially alkali metal ions, in order to assure the compatibility of the resulting structures to the integrated circuits produced in the process. For controlling structurizing of the silicon plates a homogeneous etching is necessary in which flat etching surfaces are produced.

The heretofore used etching solutions all show efficiency in one or more of these respects, which sharply limit their applicability and thereby also the manufacture of micromechanical semiconductors or so-called chips.

SUMMARY OF THE INVENTION

It is an object of the present invention to provide an etching process for semiconductor devices that will overcome the above-described disadvantages.

Briefly, a polyisoprene-base film, such as is used for the film base of a photo film of the negative type, is used as the passivating layer on the front side of the silicon plate or wafer. As a result the hillock topographies of aluminum metallizations which are difficult to mask are completely passivated. The commercially available negative photo films are very stable as a masking layer in the etching media used for the electrochemical etching process. The resulting defect density (density of the etching attacks in the aluminum) is much lower than those that can be obtained with inorganic layer systems.

It is particularly advantageous to utilize the process of the invention in connection with an electrochemical pn etch-stop, in which the plate front side must be in contact with a bias potential during the etching process.

In a single lithographic process, after the application of the photo film layer, windows can be opened in the film layer and then etching and depositing of contact material can be successively performed. The electrochemical etching can thus take place in a batch process of interest for production technology, in which many silicon slices, plates or wafers are processed simultaneously.

It is also possible in the process of the invention to etch silicon plates electrochemically which already have a structurized aluminum metallization on the front side. That is the case, for example, for integrated sensors, in which micromechanical and microelectronic functions are provided on one chip.

The negative photo film can be processed by usual and standard process steps used in semiconductor technology. This applies to the use of an adhesion agent, the application of the film to the plate, then drying in a convection oven at temperatures in the range from 60° C. to 140° C., followed by irradiating with UV lighting apparatus and the developing and hardening of the structurized (topographically modified) film layer. Thus in the use of the process of the invention neither new costly devices nor basically different handling in the protective coating are necessary.

As etchants the usual strongly alkaline etchants, namely aqueous solutions of NaOH or KOH or $NH_4OH$ are usable in the process of the invention at temperatures in the range from 50 to 150° C. As another feature of the invention, however, it is particularly advantageous to utilize etching solutions containing a tetraalkylammonium hydroxide, preferably tetramethylammonium hydroxide (TMAH), for the anisotropic etching of silicon plates or wafers, because the anisotropy ratios of the etching rate of the (100) plane with respect to all other crystal planes are favorable. The etching rate even for higher indexed planes does not lie distinctly above that of the (100) plane. The etching rate in the (100) direction, about 50 $\mu$m per hour, is very high. For the controlled and reproducible manufacture of micromechanical structures, for instance, it is advantageous for the etching surfaces that remain in the finished product to be very smooth and flat. The small content of metal ions, less than 5 ppm in the etching solution, has been found to be particularly advantageous, because the process can then be used also on silicon wafers that already contain microelectronic circuit components. This contributes to IC compatibility.

An advantageous embodiment of the process of the invention involves the use of a $p^+$ layer as an electrochemical etch-stop. In this case no electrical contact connection to the single crystal silicon layer is necessary, an advantage that substantially simplifies a batch treatment process.

BRIEF DESCRIPTION OF THE DRAWINGS

The invention is further described by way of illustrative example with reference to the annexed drawings, in which.

DESCRIPTION OF THE ILLUSTRATED METHOD

Figure 1:
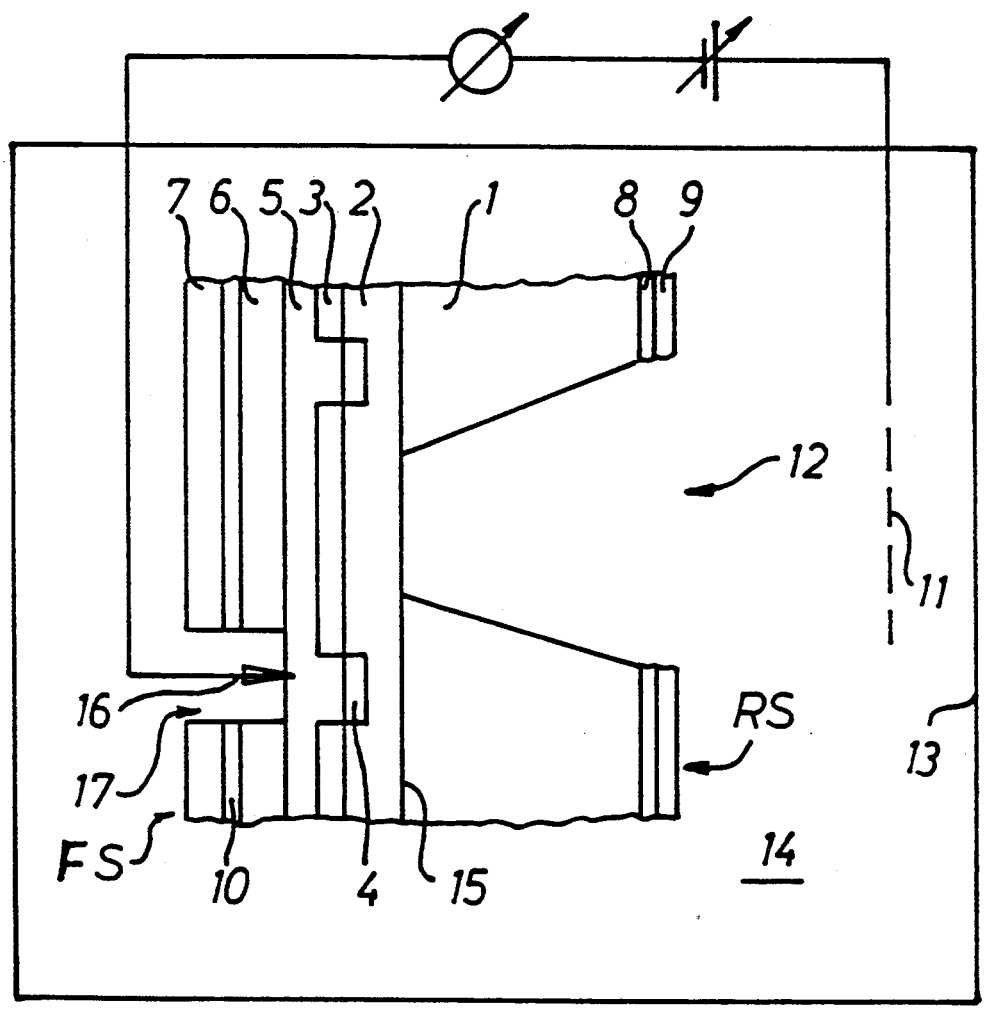
FIG. 1 is a schematic diagram showing a portion of a section through a silicon plate during anisotropic etching.

FIG. 1 shows a small part of the cross section of a silicon plate, disposed vertically in the drawing, broken off to simplify the illustration at the top and at the bottom of the portion of the section shown. The plate 1 may be described as a wafer or as a slice or as a platelet according to its particular dimensions or the nomenclature used at a particular location. It is made of silicon that is either n-doped or p-doped. At its rear side shown at the right in FIG. 1 there is a masking layer sequence composed of two layers 8 and 9 which have been deposited upon the silicon plate. These two layers consist of $Si_3N_4$ or of $SiO_2$. In the portion shown in the drawing the layers 8 and 9 are interrupted by a window 12 through which the etchant 14 located in the container 13 has access to the silicon. In the drawing the silicon plate 1 has been etched away through that window to produce a deep furrow.

At the front side FS of the plate there is a monocrystalline silicon layer 2, in this example an epitaxy layer, which is of a doping type that is opposite to the doping type of the silicon plate 1 which serves as a substrate for the epitaxial layer. As a result there is a pn or np junction or transition at the boundary 15. It is also possible to provide a p+ doped silicon layer, which may be either applied epitaxially on the substrate or produced by diffusion of foreign atoms into the substrate. Contacts for the epitaxy layer 2 are provided in the structurizing process steps now to be described, in such a way that a masking layer 3 and a contact connection diffusion 4 are produced and thereafter a metallization layer is applied and stucturized as an aluminum layer 5.

Above the aluminum layer is an intermediate layer 6 of $Si_3N_4$, on top of which a layer of organic negative photo film 7 is provided as an outer sealing layer which is held in place by means of an adhesion promoting medium 10.

In order to utilize the pn junction at the boundary between the layers 1 and 2 as an etch-stop, an electrical voltage is applied in the blocking direction between an electrode 11 in the etchant 14 and a contact 16 providing an electrical connection to the epitaxy layer 2. For the purpose of that contact a window 17 is made in the layers 6, 10 and 7 all the way to the aluminum layer 5. The thickness of the layer 6 is preferably from 0.01 $\mu$m to 3 $\mu$m.

The application of a voltage is not necessary if a p+ layer is used for the etch-stop, because the etching rate of silicon upon the etchant reaching a zone of higher doping falls sharply as a consequence of the changed electrochemical potentials at the crystal surface.

The thickness of the photo film layer 7 preferably lies between 0.5 and 50 $\mu$m. The photo film is applied in any of the well known ways, such as a spin-on process, a screen printing process or a dipping or immersion process. After its application the photo film layer is dried and hardened at temperatures between 20° C. and 300° C. in an air-circulation oven or on a heating plate.

HMDS (hexamethyl disilizane) or another silane compound, as for example aminopropyltriethoxy silane, is used as the adhesion promoting material 10. It can be applied to the photofilm layer as a gas or as liquid.

The dielectric layer 6 of $Si_3N_4$ covers the entire surface of the plate with a layer thickness in the range from 0.01 to 3 $\mu$m. The window 17 for opening up of the location for contacts for the pn etch-stop is produced therein by means of a lithographic process.

When the etching process, as shown in FIG. 1, has progressed to the point that the pn junction 15 is reached, a change takes place in the intensity of the current between the electrode 11 and the epitaxy layer 2 and the etching process is stopped.

The front side FS of the silicon plate is not attacked by the etching medium 14 because of the layer of photo film of the negative type applied over the entire surface of the front side of the plate.

ILLUSTRATIVE EXAMPLE

The following experimental results provide an example of the invention making clear the improvements which can be obtained with the process of the invention. Two silicon plates having a 1 $\mu$m thick aluminum layer on the front side were tempered in accordance with the conventional heat treatment already described above. A layer 6 of plasma-enhanced chemical vapor-deposited (PECVD) $Si_3N_4$ 800 nm thick was deposited over the aluminum and structurized so that aluminum locations, some free and some masked by the inorganic layer, were available. On one of the plates a negative photo film layer was spun on to a thickness of 3 $\mu$m. Drying and hardening of the film was carried out in a convection oven at 140° C. for 60 minutes. The plate so prepared was exposed to an 80° C. hot etchant containing 30% KOH for 6 hours. This etching time is sufficient under the above-identified conditions to etch about 500 $\mu$m deep in (110) silicon.

After the etching process the plate with the negative photo film passivating had no defects in the aluminum, not even in the regions without a PECVD inorganic intermediate layer. In contrast thereto, the plate without a negative photo film passivation had a noticeable density of defects, even under the PECVD intermediate layer. In the regions without any PECVD intermediate layer the aluminum was practically completely etched away.

The etchant 40 is alkaline and typically has a temperature in the range from 40° C. to 80° C. Etching solutions that contain a tetraalkylammonium hydroxide, preferably tetramethylammonium hydroxide (TMAH), in a concentration between 0.0001 mol and the solubility boundary at a temperature of 150° C. are particularly suitable for the process of the invention. The alkyl group R in $NR_4OH$ may have from 1 to 4 carbon atoms. Different alkyl groups may be combined in the tetraalkyl ammonium group. Two different alkyl groups $R_a$ and $R_b$ may be used, for instance, two of each preferably. The etchant mixture can also contain, as a complexing agent, ammonium hydroxide or an ammonium halide, especially ammonium fluoride, in a concentration from 0.1 ppm up to the solubility limit at a temperature of 150° C. Furthermore, inhibitors in the form of alcohols of the formula $R-CH_2-OH$ may be added to the etchant mixture, where R represents hydrogen or an alkyl group such as a methyl, ethyl or propyl group. Oxidizers containing oxygen (for example $H_2O_2$) can also be added as inhibitors and likewise ammonium ions. The latter may be provided in the form of ammonium salt compounds, particularly ammonium chlorides. Halide compounds may also be added to the etchant mixture as wetting agents, as for example $NH_4F$ or $NH_4Cl$. Further details on the composition and effects of TMAH etchants containing complexing agents and inhibitors are set forth, for example, in Examples 2-5 of U.S. Pat. No. 4,113,511.

Figure 2:
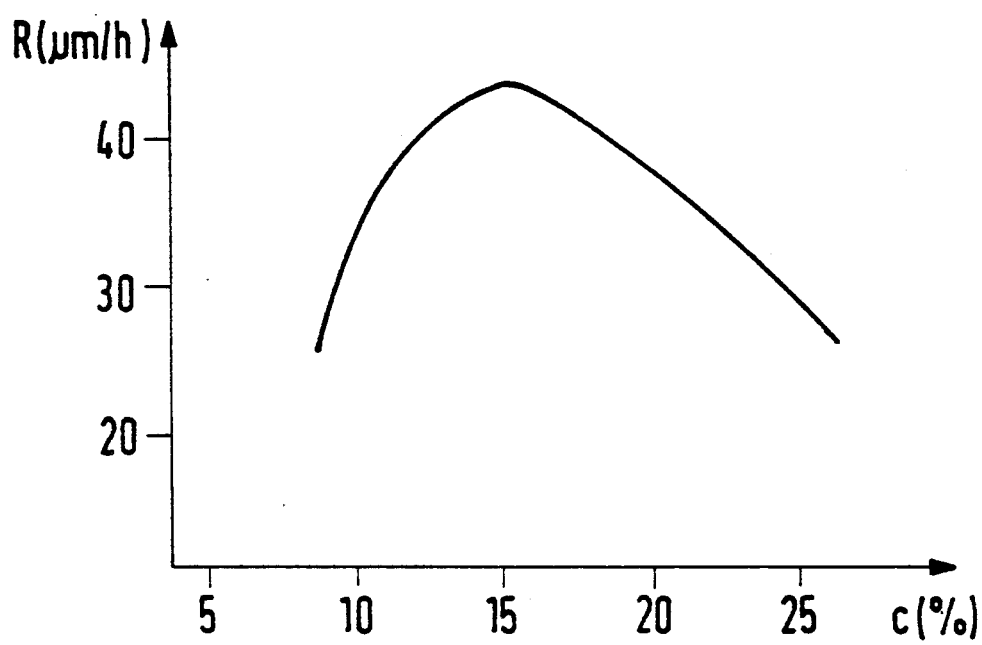
FIG. 2 is a graphical representation of the relation between the etching rate and the concentration of a TMAH etching medium.

FIG. 2 shows the dependence of the etching rate on the concentration of TMAH in percentage by volume, for a temperature of 80° C. of the etchant. The etching rate runs through a maximum at about 15% by volume and declines steeply on both sides of that maximum. When 25% TMAH is used as the etchant a small surface roughness is obtained at an etching rate of 30 μm per hour.

Figure 3:
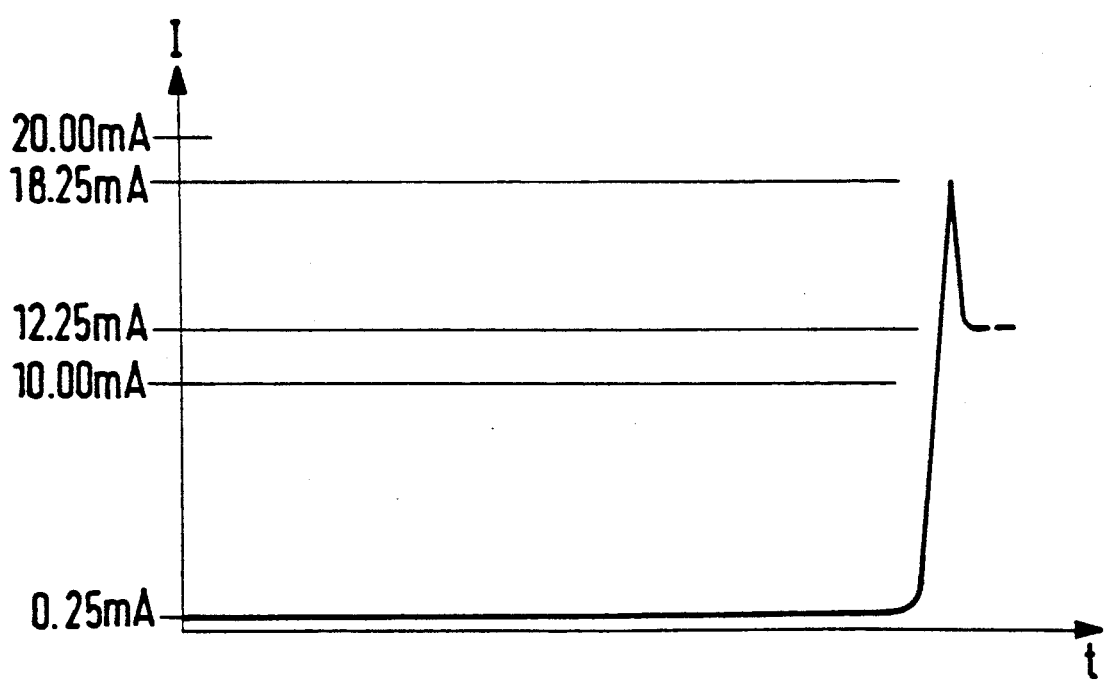
FIG. 3 is a graphical representation of the current/time characteristic of etching before and during a pn etch-stop.

FIG. 3 shows the current/time characteristic during etching continued to an etch-stop at a pn junction. The etchant was 20% TMAH temperature of 80° C. The applied voltage was 1 V. Under those conditions an etching rate of 40 μm per hour was measured. With etching under voltage bias the roughness of the etching surface was reduced. The small current of only 0.25 mA was present until the etch-stop was approached and is conspicuous in FIG. 3. The etch-stop can be recognized in FIG. 3 by the current peak.

Another advantage of the process of the invention is the full compatibility with microelectronic fabrication methods. The method of the invention can be applied to wafers bearing already microelectronic devices and circuitry without deteriorating the device performance. This application is necessary for the integration of microelectronic and micromechanical functions, e.g. to obtain integrated types of sensors with signal conditioning circuitry on chip.

Prior to the electrochemical etching process the silicon wafer can run through a complete device fabrication cycle. This might include diffusions, ion implantations, layer deposition processes, lithography, dry or wet etching processes, etc.

It does not matter which type of device is established by the process procedure (MOS, bipolar, etc.).

Usually the final step of a microelectronic device fabrication cycle is the deposition and patterning of the metallization. The metal lines connect various devices in order to achieve a certain chip function. The metal layers used for microelectronic devices are with respect to their resistivities, the thicknesses and all the other properties, all suited to provide also the connection for the electrochemical etching procedure of the invention.

The only requirement for carrying out the electrochemical process with etch-stop then is:

A pn junction has to be located below the microelectronic devices. In case of bipolar devices the pn junction is mostly part of the devices itself and, therefore, does not require additional process steps. In case of MOS-devices, an n-epitaxial layer has to be grown prior to the beginning of the device processing.

Although the invention has been described with reference to a particular example, it will be recognized that modifications and variations are possible within the inventive concept.

We claim:

1. A process of anisotropically etching a silicon plate having a thickness dimension which is the smallest of three mutually perpendicular dimensions of the plate and having first and second portions of opposite conductivity types (p, n) adjoining each other along a mutual boundary surface essentially perpendicular to the thickness dimension of the plate, said first plate portion being monocrystalline, said process including modifying the front side of said plate at the external surface of said monocrystalline first portion of the plate through gaps of at least one inorganic masking layer, said modifying being performed by a process step of etching a topographic configuration extending into said monocrystalline first plate portion from the plate side provided by it and stopping short of said boundary, a process step of depositing metallization on said first plate portion or a sequential combination of said process steps in the order named, and a process step of etching the side of said plate presented by said second plate portion, characterized in that after said modifying of said monocrystalline first portion and before etching said second plate portion, the exposed surface of said first plate portion is protectively covered by a passivating layer of a polyisoprene-base film of a type suitable for use as a film base for negative-type photographic film, and remains so covered while said first plate portion is etched.

2. The process of claim 1, wherein just prior to the covering of the exposed surface of said first plate portion by said passivating layer, said exposed surface is covered by an adhesion-promoting layer of a silane compound for promoting adhesion of said passivating layer to said exposed surface.

3. The process of claim 1, wherein prior to the covering the exposed surface of said first plate portion by said passivating layer, said exposed surface is first provided with at least one dielectric layer of silicon dioxide or silicon nitride.

4. The process of claim 2, wherein prior to the covering of said exposed surface of said first plate portion with said adhesion-promoting layer, said exposed surface is first covered with a dielectric layer of silicon dioxide or silicon nitride.

5. The process of claim 1, wherein the thickness of said passivating layer lies in the range from 0.5 μm to 50 82 m.

6. The process of claim 1, wherein the covering of said exposed surface of said first plate portion by said passivating layer is performed by a spin-on method, a screen-printing method or an immersion method.

7. The process of claim 1, wherein the step of covering of said exposed surface of said first plate portion by said passivating layer is completed by drying and hardening said passivating layer on said exposed surface at a temperature in the range from 20° C. to 300° C.

8. The process of claim 3, wherein said dielectric layer is applied to said exposed surface of said first plate portion so as to cover all of said exposed surface.

9. The process of claim 3, wherein prior to the covering of said exposed surface with said at least one dielectric layer, said exposed surface of said first plate portion is covered with an aluminum layer and wherein the subsequent covering of said exposed surface by said dielectric layer covers said exposed surface entirely.

10. The process of claim 9, wherein prior to the covering of said exposed surface of said first plate portion with said aluminum layer, said exposed surface is covered with a masking dielectric layer of silicon dioxide or silicon nitride in a masking pattern.

11. The process of claim 3, wherein the thickness of said at least one dielectric layer is in the range from 0.01 μm to 3 μm.

12. The process of claim 4, wherein the thickness of said dielectric layer is in the range from 0.01 μm to 3 μm.

13. The process of claim 9, wherein the thickness of said at least one dielectric layer is in the range from 0.01 μm to 3 μm.

14. The process of claim 10, wherein the thickness of said masking dielectric layer is in the range from 0.01 μm to 3 μm.

15. The process of claim 3, wherein said at least one dielectric layer is deposited on said exposed surface of said first plate portion as a spin-on film by chemical vapor deposition by the low pressure chemical vapor deposition (LPCVD) method or by the plasma-emphasized chemical vapor deposition (PECVD) method.

16. The process of claim 4, wherein said dielectric layer is deposited on said exposed surface of said first plate portion as a spin-on film by continuous vapor deposition by the low pressure continuous vapor deposition (LPCVD) method or by the plasma-enhanced chemical vapor deposition (PECVD) method.

17. The process of claim 11, wherein said masking dielectric layer is deposited on said exposed surface of said first plate portion as a spin-on film by continuous vapor deposition by the low pressure continuous vapor deposition (LPCVD) method or by the plasma-enhanced chemical vapor deposition (PECVD) method.

18. The process of claim 2, wherein the covering of said exposed surface of said first plate portion by said adhesion-promoting layer is performed in the liquid or gaseous phase of said silane compound and wherein said silane compound is hexamethyldisilazane or aminopropyltriethoxysilane.

19. The process of claim 4, wherein the covering of said exposed surface of said first plate portion by said adhesion-promoting layer is performed in the liquid or gaseous phase of said silane compound and wherein said silane compound is hexamethyldisilazane or aminopropyltriethoxysilane.

20. The process of claim 1, wherein said passivating layer, after its provision on said exposed surface of said first plate portion, is topographically modified by a lithographic method for providing a window opening through which a contact connection to said first portion of said plate can be made in a subsequent process step for use in providing an etch-stop.

21. The process of claim 1, wherein on the surface of said second plate portion which is not adjacent to said first plate portion a plurality of masking layers are deposited in sequence, consisting of silicon nitride, silicon dioxide or of a mixture of silicon nitride and silicon dioxide and are then topographically modified to provide at least window openings through which an etchant may penetrate into said second plate portion.

22. The process of claim 1, wherein all process steps of etching are performed with inorganic alkaline etchants at temperatures in the range from 50° C. to 150° C.

23. A process of anisotropically etching a silicon plate having a thickness dimension which is the smallest of three mutually perpendicular dimensions of the plate and having first and second portions of opposite conductivity types (p, n) adjoining each other along a mutual boundary surface essentially perpendicular to the thickness dimension of the plate, said first plate portion being monocrystalline, said process including modifying the front side of said plate at the external surface of said monocrystalline second portion of the plate through gaps of at least one inorganic masking layer, said modifying being performed by a process step of etching a topographic configuration extending into said monocrystalline first plate portion from the plate side provided by it and stopping short of said boundary, a process step of depositing metallization on said first plate portion or a sequential combination of said process steps in the order named, a step of providing a passivating layer protecting the exposed surface of the first plate portion, and a process step of etching the side of said plate presented by said second plate portion, characterized in that the etching steps are performed with an etchant mixture containing, as an etchant, an organically substituted ammonium hydroxide of the formula $NR_4OH$ in aqueous solution or in water-free state, wherein R designates an alkyl group containing not more than four carbon atoms, said etchant mixture including as an additive a complexing agent, an inhibitor, or a wetting agent, or two or more additives selected from complexing agents, inhibitors and wetting agents.

24. The process of claim 23, wherein said alkyl groups having three or four carbon atoms are straight chain alkyl groups.

25. The process of claim 23, wherein the concentration of said $NR_4OH$ etchant in the etchant mixture is in the range from 0.001 mol to the solubility limit of said etchant at 150° C.

26. The process of claim 23, wherein said etchant is of the formula $NR'_m R''_{4-m}OH$, wherein R' is a first alklyl group and R" is a second alkyl group and m is a whole number from 1 to 4.

27. The process of claim 23, wherein said etchant mixture contains a complexing agent additive which is ammonium hydroxide or a fluorine compound, in a concentration in the range from 0.01 ppm to the solubility limit for said additive at 150° C.

28. The process of claim 23, wherein said etchant mixture contains, as an inhibitor additive at least one alcohol of the formula $R-CH_2OH$., in which R is hydrogen or an alkyl group having from one to three carbon atoms.

29. The process of claim 23, wherein said etchant mixture contains an inhibitor additive which is an oxygen containing oxidizer.

30. The process of claim 1, wherein said etchant mixture contains as an inhibitor additive a compound containing alkyl-substituted ammonium ions or unsubstituted ammonium ions.

31. The process of claim 23, wherein said etchant mixture contains, as a wetting agent additive, a fluorinated compound.

32. The process of claim 1, which includes a step of providing an external connection having electrical contact with a pn or np junction at said boundary between said first and second portions of said silicon plate produced by etching a hole into said first portion prior to etching said second portion and these forming a contact at the extremity of said hole and making an external connection thereto, and wherein during etching of said second portion while said first portion is protected by said passivating layer, the electrical behavior at said junction observable at said external electrical contact connection is observed and the etching of said second portion is controllably stopped upon the observation or detection of a predetermined change of said electrical behavior.

33. The process of claim 23, which includes a step of providing an external connection having electrical contact with a pn or np junction at said boundary between said first and second portions of said silicon plate by etching a hole into said first portion prior to etching said second portion and these forming a contact at the extremity of said hole and making an external connection thereto, and wherein during etching of said second portion while said first portion is protected by said passivating layer, the electrical behavior at said junction observable at said external electrical contact is observed and the etching of said second portion is controllably stopped upon the observation or detection of a predetermined change of said electrical behavior.

34. The process of claim 32, wherein the step of depositing aluminum conduction paths having a layer thickness of 0.1 to 4 μm adjacent to said junction is performed as a preliminary step of providing said external electrical connection and contact for said junction.

35. The process of claim 33, wherein the step of depositing aluminum conduction paths having a layer thickness of 0.1 to 4 μm adjacent to said junction is performed as a preliminary step of providing said external electrical connection and contact for said junction.

36. The process of claim 1, wherein a p+ layer is produced adjacent to said boundary in the formation of said first portion of said silicon plate, for providing an etch-stop in the etching of said second portion of said silicon plate after said first plate portion is protectively covered by said passivating layer, without the necessity of an electrical connection contact to said junction.

37. The process of claim 23, wherein a p+ layer is produced adjacent to said boundary in the formation of said first portion of said silicon plate for providing an etch-stop in the etching of said second portion of said silicon plate after said first plate portion is protectively covered by said passivating layer, without the necessity of an electrical connection contact to said junction.

38. The process of claim 23, wherein passivation is produced by protectively covering the exposed surface of said first plate portion by a passivating layer of a polyisoprene-base film of a type suitable for use as a film base for negative-type photographic film which remains in place while said first plate portion is etched.

39. The process of claim 1, wherein the thickness of the residual thickness of the silicon plate in etch grooves, after the completion of all etching steps for said silicon plate, lies between 0.1 and 500 μm.

40. The process of claim 1, wherein said silicon plate is etched completely through at certain locations by masked through-etching from one or the other side of said plate.

41. The process of claim 3, wherein said silicon plate is etched completely through at certain locations by masked through-etching from one or the other side of said plate.

42. The process of claim 1, wherein said process is applied to a silicon plate already preliminarily etched isotropically or anisotropically.

43. The process of claim 23, wherein said process is applied to a silicon plate already preliminarily etched isotropically or anisotropically.

44. The process of claim 1, wherein said silicon plate is a silicon plate which already contains microelectronic components produced therein by previous treatment.

45. The process of claim 23, wherein said silicon plate is a silicon plate which already contains microelectronic components produced therein by previous treatment.

* * * * *